(12) United States Patent
Shindo et al.

(10) Patent No.: US 7,649,152 B2
(45) Date of Patent: Jan. 19, 2010

(54) CONDUCTIVE BALL BONDING METHOD AND CONDUCTIVE BALL BONDING APPARATUS

(75) Inventors: Osamu Shindo, Tokyo (JP); Toru Mizuno, Tokyo (JP); Satoshi Yamaguchi, Tokyo (JP)

(73) Assignees: TDK Corporation, Tokyo (JP); SAE Magnetics (H.K.) Ltd., Shatin, N.T. (HK)

( * ) Notice: Subject to any disclaimer, the term of this patent is extended or adjusted under 35 U.S.C. 154(b) by 838 days.

(21) Appl. No.: 11/233,090

(22) Filed: Sep. 23, 2005

(65) Prior Publication Data

US 2006/0065641 A1 Mar. 30, 2006

(30) Foreign Application Priority Data

Sep. 24, 2004 (JP) ............................. 2004-276655

(51) Int. Cl.
  *B23K 26/00* (2006.01)
  *B23K 3/00* (2006.01)
(52) U.S. Cl. ............................... 219/121.64; 219/85.12
(58) Field of Classification Search . 219/121.6–121.86, 219/85.1–85.22; 228/19, 33, 41, 245, 246
See application file for complete search history.

(56) References Cited

U.S. PATENT DOCUMENTS 5,227,604 A * 7/1993 Freedman .............. 219/121.63
6,336,581 B1   1/2002 Tuchiya et al.
6,543,677 B2   4/2003 Pattanaik et al.
6,769,599 B1 * 8/2004 Momeni et al. ........ 228/180.22

FOREIGN PATENT DOCUMENTS

| JP | 62-58066  | 4/1987 |
| JP | 5-111752  | 5/1993 |
| JP | 5-121621  | 5/1993 |
| JP | 6-23529   | 2/1994 |
| JP | 6-77638   | 3/1994 |
| JP | 8-236916  | 9/1996 |

(Continued)

OTHER PUBLICATIONS

U.S. Appl. No. 11/686,514, filed Mar. 15, 2007, Wagou, et al.

*Primary Examiner*—Sang Y Paik
(74) *Attorney, Agent, or Firm*—Oblon, Spivak, McClelland, Maier & Neustadt, L.L.P.

(57) ABSTRACT

The present invention provides a solder ball bonding method and a solder ball bonding apparatus, which can enhance efficiency of bonding processing and in which plural electrodes formed on objects to be bonded are bonded to each other by melting a solder ball. In the present invention, the solder balls are picked up by a pick-up nozzle having a plurality of pick-up openings corresponding to electrode areas on the objects to be bonded and the solder balls are conveyed on the electrode areas. A laser radiating unit disposed independently above the pick-up nozzle is shifted along an arrangement direction of the pick-up openings and a laser beam from the laser radiating unit is irradiated onto the solder ball through a transparent member of the pick-up nozzle and through the pick-up opening of the pick-up nozzle, thereby melting the solder ball on the electrode area.

8 Claims, 6 Drawing Sheets

FOREIGN PATENT DOCUMENTS

| | | |
|---|---|---|
| JP | 9-18127 | 1/1997 |
| JP | 2680204 | 8/1997 |
| JP | 11-509375 | 8/1999 |
| JP | 2001-44607 | 2/2001 |
| JP | 2002-25025 | 1/2002 |
| JP | 2002-45962 | 2/2002 |
| WO | WO 97/20654 | 6/1997 |

* cited by examiner

CONDUCTIVE BALL BONDING METHOD AND CONDUCTIVE BALL BONDING APPARATUS

BACKGROUND OF THE INVENTION

1. Field of the Invention

The present invention relates to a conductive ball bonding method and a conductive ball bonding apparatus and, more particularly, it relates to a conductive ball bonding method and a conductive ball bonding apparatus, suitable for performing minute bonding represented by bonding between a bonding pad formed on a slider of a magnetic head and a pad formed on a lead frame. Typical conductive ball is a solder ball, gold ball, or alloy ball.

2. Related Background Art

In the past, a bonding method in which, after spherical solder (referred to as "solder ball" hereinafter) is installed between electrodes, the solder ball is melted by irradiating a laser beam onto the solder ball to achieve electrical connection between the electrodes are also known.

Figure 7A:
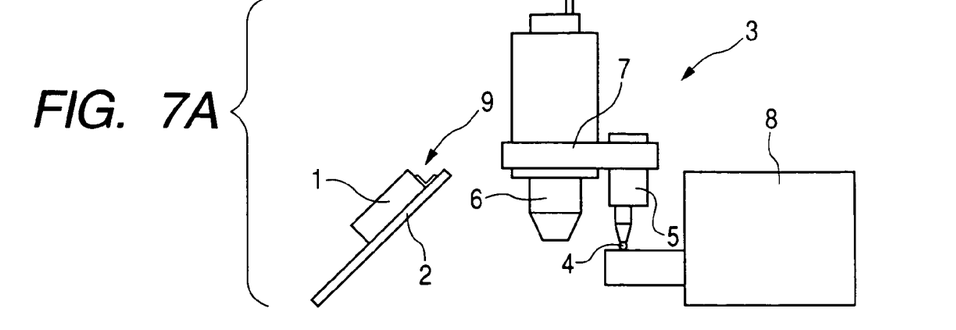
FIGS. 7A, 7B and 7C are explanatory views showing steps for performing bonding between electrodes by using melting the solder ball by laser irradiation.
Figure 7B:
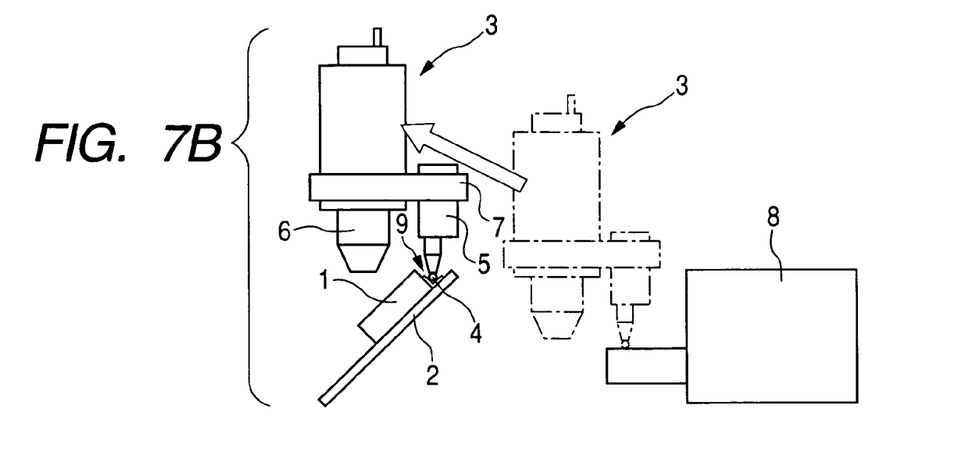
Figure 7C:
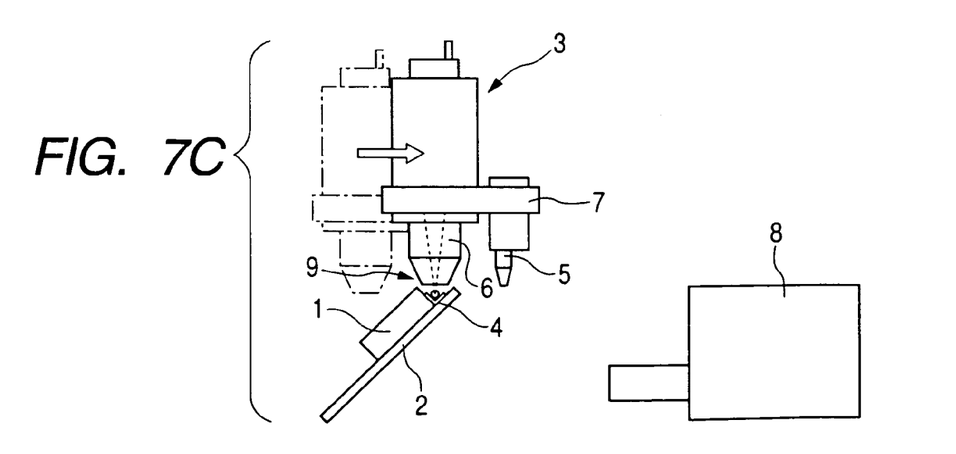

FIGS. 7A to 7C are explanatory views showing steps for achieving the bonding between the electrodes by melting the solder ball using the laser beam irradiation. Incidentally, these figures refer to bonding between a bonding pad formed on a slider of a magnetic head and a pad formed on a lead frame.

In such bonding in the magnetic head, first of all, as shown in FIG. 7A, a slider 1 constituting a magnetic head and a flexor 2 for supporting the slider 1, which are to be bonded to each other, are previously interconnected by using an adhesive so that electrodes thereof are contacted with each other.

A bonding apparatus 3 for achieving the bonding between the slider 1 and the flexor 2 comprises a pick-up nozzle 5 for picking up a solder ball 4 and a laser radiating unit 6 for irradiating a laser beam onto the solder ball 4, and the pick-up nozzle 5 and the laser radiating nozzle 6 are fixed by a connection block 7 and are reciprocally shifted between the magnetic head and a solder ball supplying device 8 by means of shifting means (not shown).

At the time of performing the bonding between the slider 1 and the flexor 2, first of all, the bonding apparatus 3 is shifted toward the supplying device 8, and then, the solder ball 4 is picked up from the supplying device 8 by utilizing the pick-up nozzle 5. After the solder ball 4 is picked up by the pick-up nozzle 5, the shifting means is operated to convey the solder ball 4 to an electrode area 9 where electrodes of the slider 1 and the flexor 2 are contacted with each other, as shown in FIG. 7B, and thereafter, the suction or absorption of the pick-up nozzle 5 is ceased thereby to rest the solder ball 4 on the electrode area 9. Then, as shown in FIG. 7C, after the solder ball 4 is rested on the electrode area 9, the shifting means is operated again to shift the laser radiating unit 6 above the solder ball 4 and then, the laser beam is irradiated onto the solder ball 4 to melt the solder ball 4, thereby achieving connection between the electrodes formed on the slider 1 and the flexor 2 (for example, refer to JP2002-25025A).

As another bonding apparatus using the solder ball, for example, a bonding apparatus comprising a laser light source disposed upwardly and a connecting element provided at its side with a connection piece for supplying a solder ball and wherein, after the solder ball is dropped into the connecting element, the solder ball is melted by the laser light source is also known (for example, refer to JP H11-509375A).

Furthermore, a technique in which a three-layer structure comprising an arranging mask, a shutter mask and a supplying mask is provided and a solder ball is freely dropped from the arranging mask toward the supplying mask by a sliding movement of the shutter mask interposed between the arranging mask and the supplying mask thereby to supply the solder ball on a pad and to perform the bonding is also known (for example, refer to JP H08-236916A).

However, all of the above-mentioned bonding apparatuses have the following problems.

That is to say, in the bonding apparatus (for example, the apparatus shown in FIGS. 7A to 7C) in which the solder ball is used and the pick-up nozzle and the laser radiating unit 6 are provided separately, after the solder ball 4 is rested on the electrode area 9 by using the pick-up nozzle 5, since the solder ball 4 cannot be held at the bonding apparatus side, the solder ball 4 rested on the electrode area 9 may be deviated from the correct position due to disturbance. Thus, there arises a problem that means for holding the solder ball 4 must be provided separately from the product and the bonding apparatus.

Further, the bonding apparatus using the pressure bonding, the bonding apparatus including the pick-up nozzle 5 and the laser radiating unit 6 separately or the bonding apparatus including the laser light source and the connecting element provided with the connection piece only serve to perform the bonding regarding the single electrode, and, thus, if there are a plurality of electrodes, the process must be repeated by times corresponding to the number of electrodes, with the result that it is difficult to enhance the manufacturing efficiency.

Further, in an arrangement in which the laser radiating unit 6 and the pick-up nozzle 5 are shifted simultaneously, since the connecting block 7 is required to be shifted smoothly, introduction of the laser beam from the laser light source to the laser radiating unit 6 must be performed by using an optical fiber or the like. Since a flexible property of the optical fiber or the like is poorer than those of normal fibrous elements, in the view point of endurance of the apparatus, it is not preferable that the optical fiber be used in the arrangement in which deformation such as bending is inevitable.

SUMMARY OF THE INVENTION

The present invention is made in consideration of the above-mentioned conventional problems arose particularly when the pick-up nozzle is shifted by the long stroke as shown in FIGS. 7A to 7C, and an object of the present invention is to provide a conductive ball, such as solder ball and gold ball bonding method and a conductive ball bonding apparatus, which can supply the conductive ball efficiently and can enhance endurance of the bonding apparatus. Further, an object of the present invention is to provide a conductive ball, such as solder ball and gold ball bonding method and a conductive ball bonding apparatus, in which a plurality of conductive balls are simultaneously supplied to objects to be bonded and are held therein, and an bonding operation using these conductive balls can be performed continuously by using a laser beam obtained from a single laser light source, thereby enhancing efficiency of a bonding process.

In order to achieve the above objects, the present invention provides a conductive ball bonding method for bonding a plurality of electrodes formed on objects to be bonded, by using conductive balls to be melted, the method comprising the steps of absorbing the conductive balls by means of a pick-up nozzle having pick-up openings corresponding to the electrodes on the objects to be bonded and conveying the conductive balls to the electrodes, irradiating a laser beam through a transparent member defining a substantially closed space within the pick-up nozzle so that the laser beam reach the conductive ball through the pick-up openings of the pick-up nozzle, and melting the conductive ball on the electrodes by the irradiation of the laser beam.

Incidentally, in the above-mentioned bonding method, it is preferable that pick-up nozzle is stopped in a condition that the corresponding conductive balls are supplied onto the plural electrodes, and a laser radiating unit for irradiating the laser beam is shifted in a direction substantially parallel to an arrangement direction of the plural electrodes independently from the pick-up nozzle to melt the conductive balls. Alternatively, in the above-mentioned bonding method, it is preferable that, when the laser beam is irradiated onto the conductive ball, inert gas is delivered through the pick-up opening of the pick-up nozzle.

Further, in order to achieve the above objects, the present invention provides a conductive ball bonding apparatus in which a conductive ball is conveyed to electrodes formed on objects to be bonded and the conveyed conductive ball is melted by irradiation of a laser beam to bond the electrodes, the bonding apparatus comprising a pick-up nozzle including a pick-up opening for picking up the conductive ball, a substantially closed space communicated with the pick-up opening and a transparent member disposed in a confronting relationship to the pick-up opening in the substantially closed space and defining the substantially closed space, and a laser radiating unit disposed in a confronting relationship to the pick-up opening with the interposition of the transparent member and being characterized in that the laser radiating unit and the pick-up nozzle can be shifted relative to each other. Incidentally, in the above-mentioned apparatus, it is preferable that the relative shifting movement between the laser radiating unit and the pick-up nozzle is realized along a straight line parallel to a plane substantially including a plurality of bonded portions in the electrodes.

Further, in order to achieve the above objects, the present invention provides a pick-up nozzle used in a case where an object to be held is conveyed up to a predetermined position while sucking and holding the object and predetermined processing of the object to be held is performed by irradiating a laser beam onto the object to be held in a condition that the object to be held is substantially held in the predetermined position, the pick-up nozzle comprising a pick-up opening for picking up the object to be held, a substantially closed space communicated with the pick-up opening and capable of being evacuated and vacuum-ruptured, and a transparent member disposed in a confronting relationship to the pick-up opening and forming a part of a wall defining the substantially closed space and capable of permeating the laser beam.

In case of the bonding method for melting the conductive ball by using the laser beam, it is necessary to enhance accuracy of an irradiating position of the laser beam on the conductive ball in order to melt the conductive ball efficiently. According to this viewpoint, it is preferable that the pick-up nozzle and the laser radiating unit are integrated so that a positional relationship between the conductive ball holding position of the pick-up nozzle and the laser radiating unit is fixed or constant. However, with this arrangement, since the above-mentioned optical fiber associated with the laser radiating unit and various cables must be wired and bending deformation must be allowed, high possibility of arising a problem regarding the endurance of the apparatus itself enduring the repeated operations will exist. At the same time, for example, it is difficult to apply such an arrangement to the processing for continuously processing the plural solder balls. Further, if it is tried to permit the shifting movement of the laser radiating unit relative to the pick-up nozzle while maintaining integration between the laser radiating unit and the pick-up nozzle, there arise a problem how preserve a sealing ability for a conjugate space formed in the pick-up nozzle.

According to the present invention, the conjugate space communicated with air feeding and draining means can be formed independently from the laser radiating unit. Accordingly, the interior of the conjugate space can easily be maintained to a reduced pressure environment and the conductive balls can be picked up by the absorbing action of the pick-up nozzle. After the conductive balls are picked up by the pick-up nozzle, the pick-up nozzle is shifted to align the plural pick-up openings with positions of the plural electrode areas and, thereafter, when pressure is introduced into the conjugate space by the air feeding and draining means to return the interior of the conjugate space from the reduced pressure environment to an atmospheric pressure (so-called vacuum rupture), the sucking force of the pick-up nozzle is released, with the result that the conductive balls can be separated from the pick-up nozzle.

Then, after the conductive balls can be separated from the pick-up nozzle, the laser beam is irradiated onto the conductive ball by the laser radiating unit to melt the conductive ball, thereby achieving the electrical bonding between the electrodes of the objects to be bonded. Incidentally, when the laser beams is irradiated, in order to prevent the conductive ball from being oxidized, inert gas may be introduced into the conjugate space by inert gas feeding means to inject the inert gas toward the conductive ball through the pick-up nozzle.

After one of the conductive balls rested on the plural electrode areas is melted to bond the electrodes in this way, the conveying means are operated to shift the laser radiating unit in a predetermined direction by a small amount. The shifting operation of the laser radiating unit is performed until the irradiated laser beam can pass through the adjacent pick-up opening. By repeating the shifting movement of the laser radiating unit and the laser irradiation onto the conductive ball, the adjacent respective electrodes may be bonded.

By using such an arrangement, since the plural conductive balls can be melted by the single laser radiating unit, the bonding time can be reduced.

Further, when a regulating face is provided at a distal end of the pick-up nozzle, since a rolling movement of the conductive ball can be regulated by the regulating face and a V-shaped groove formed at the electrode area, even if the reduced pressure environment in the conjugate space is released and the conductive ball is separated from the pick-up nozzle, the conductive ball can be prevented from being separated from the electrode area. Thus, the conductive ball can be melted positively, thereby further enhancing reliability of the bonding of the electrode area.

Incidentally, in the pick-up nozzle according to the present invention, a single conductive ball may be picked up, held and conveyed or a plurality of conductive balls may be picked up, held and conveyed simultaneously. In a case where the single conductive ball is held, according to the present invention, the pick-up nozzle and the laser radiating unit are constituted separately and the driving such as the conveying of the conductive ball is performed by the pick-up nozzle alone and the laser radiating unit is fixed. In this way, the construction of the apparatus can be simplified. Whereas, in a case where a plurality of conductive balls are held simultaneously, the pick-up openings may be formed as mentioned above.

That is to say, in the present invention, the laser radiating unit and the pick-up nozzle can be constituted independently and these elements can be shifted relative to each other. Further, in a case where there are plural points to be bonded on the electrode, desired bonding can be achieved by performing the relative shifting movement between the laser radiating unit and the pick-up nozzle along a straight line extending in parallel with a plane including such plural points. Incidentally, depending upon objects to be bonded, it is considered that plural points to be bonded exist in different planes. In this case, a plane including the largest number of points may be referred to. Accordingly, such a plane is preferably a flat plane in the wording.

According to the present invention, in a condition that the conductive ball is substantially held at the distal end of the pick-up nozzle, the melting of the conductive ball and the bonding between the plural electrodes formed on the object to be bonded are performed. Accordingly, it is possible to perform the bonding between the electrodes while maintaining the positional relationship of the conductive ball regarding the electrodes correctly. Further, vacuum evacuation for absorbing and holding the conductive ball and the supplying the insert gas to the conductive ball for preventing the oxidization of the melted conductive are performed via the conjugate space having the minimum required dimension and high sealing ability. Accordingly, a tube for supplying and discharging the gas and the like can be obtained with this construction of the apparatus, i.e. simple construction and the construction of the pick-up nozzle can be simplified.

Further, the driving amount of the laser radiating unit can be minimized only in one direction, with the result that, since the long shifting movement of the laser radiating unit while dragging the optical fiber or the like is eliminated, the possibility of damaging the optical fiber or the like can be reduced greatly. Further, regarding an optical system for performing the irradiation of the laser beam, since a shifting movement thereof within a limited region along one direction may be taken into account, change in a focal point of the laser radiating unit caused by the shifting movement of the optical system becomes relatively small in comparison with those in the conventional arrangements. Thus, various means for obtaining stable laser irradiation energy regardless of the change in the focal point are almost not required in the arrangement according to the present invention, thereby simplifying the construction of the apparatus. Further, it is possible to perform the shifting and stopping operations of the optical system correctly and reproducibly. Furthermore, even with the simplified construction, the melting operation for the solder ball can be performed stably. Incidentally, these effects are exhibited more remarkably when the plurality of solder balls are melted continuously, as shown in embodiments of the present invention which will be described later.

Further, in the present invention, an electrode of a flexor which is one of the objects to be bonded is formed on an upper surface of the flexor made of material having less heat-resistance ability than that of metal, and, thus, upon the irradiation of the laser beam, it is necessary that the laser beam be prevented from irradiating onto the flexor. Further, in order to obtain a preferable bonding condition between the solder ball and the electrode, it may be necessary that the laser beam be irradiated onto a part of the electrode. Accordingly, it is necessary that an irradiating pattern of the laser beam (so-called beam configuration) be adjusted by using a mask. In the arrangement according to the present invention, it is possible to use the pick-up opening of the pick-up nozzle as such a mask. By irradiating the laser beam from the laser radiating unit as a substantially parallel light beam and by restricting of a diameter of the beam to some extent, even if the irradiating position is deviated slightly, such deviation can be cancelled due to the presence of the pick-up opening as the mask. Accordingly, by using the pick-up opening as the mask, the driving error of the optical system constituting the laser radiating unit can be absorbed and the preferable bonding condition can be obtained.

The above and other objects, features and advantages of the invention will become more apparent from the following detailed description taken in conjunction with the accompanying drawings.

BRIEF DESCRIPTION OF THE DRAWINGS

FIGS. 2A and 2B are explanatory views showing a structure of the conductive ball bonding apparatus, where

DESCRIPTION OF THE PREFERRED EMBODIMENTS

Figure 1:
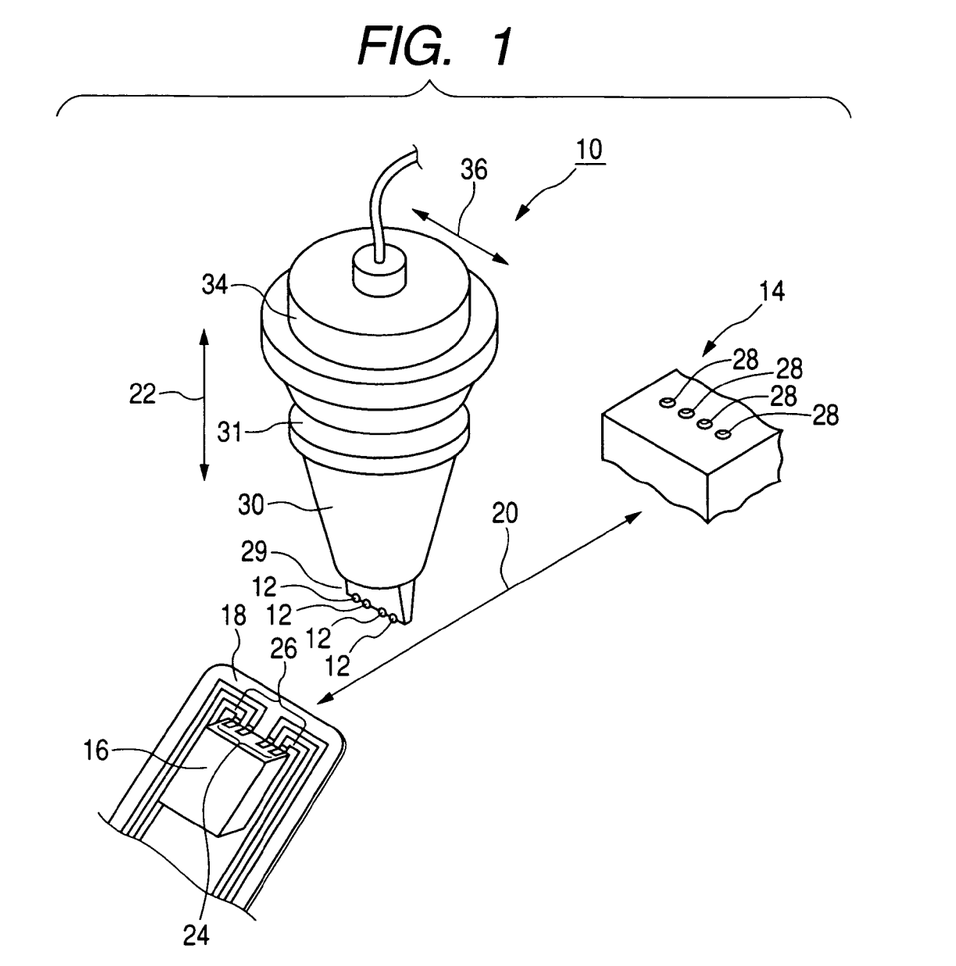
FIG. 1 is a perspective view showing a whole conductive ball bonding apparatus according to an embodiment of the present invention.

Now, a concrete embodiment suitable for a conductive ball bonding method and a conductive ball bonding apparatus according to the present invention will be fully explained with reference to the accompanying drawings, and in the embodiment a solder boll is used as an example of the conductive ball. FIG. 1 is a perspective view showing a whole solder ball bonding apparatus according to the embodiment. As shown in FIG. 1, a solder ball bonding apparatus 10 according to the illustrated embodiment is constituted by a pick-up nozzle 29 and a laser radiating unit 34. The pick-up nozzle 29 can be reciprocally shifted, by shifting means (not shown), between a supplying device 14 for supplying a solder ball 12 and constituting parts of a magnetic head to be bonded (that is to say, a slider 16 into which a GMR element and the like is embedded and a flexor 18 for supporting the slider 16). Incidentally, the shifting means can be shifted in directions shown by the arrows 20 and 22 and the shifting movement between the supplying device 14 and the constituting parts of the magnetic head is achieved by a combination of the directions shown by the arrows 20 and 22. Further, suction of the solder ball 12 by a pick-up nozzle and positioning of the solder ball 12 with respect to an electrode area on the magnetic head, which will be described later, are judged by image recognition means (not shown) cooperating with the shifting means, and, on the basis of information from the image recognition means, the shifting means perform correct positioning of positions of interest.

Here, in this embodiment, four slider side electrodes 24 are formed on the slider 16 and the number of flexor side electrodes 26 corresponding to the number of the slider side electrodes 24 are formed on the flexor 18. The slider side electrodes 24 and the flexor side electrodes 26 are arranged in such a manner that edges thereof abut against each other and they are disposed in perpendicular to each other (that is to say, a V-shaped groove is formed by the slider side electrode 24 and the flexor side electrode 26).

Further, in correspondence to the electrodes formed on the slider 16 and the flexor 18, the supplying device 14 for the solder ball 12 is provided with solder ball supplying holes 28 disposed in parallel with an arranging direction of the electrodes with a pitch same as that between the electrodes. The plurality of solder balls 12 can be supplied simultaneously from the supply holes 28.

The pick-up nozzle 29 reciprocally shifted between the supplying device 14 and the magnetic head is mainly constituted by a conical cylinder 30 forming a part of a main body of the apparatus, a plurality of pick-up openings 32 (refer to FIGS. 2A and 2B) formed in a lower side of the cylinder, and a transparent member 31 disposed at a side of the conical cylinder 30 opposite to the openings 32. Further, the laser radiating unit 34 is connected to conveying means (not shown) so that the laser radiating unit 34 can be shifted in directions shown by the arrow 36 i.e. the arranging direction of the electrodes by operating such conveying means (not shown).

Figure 2A:
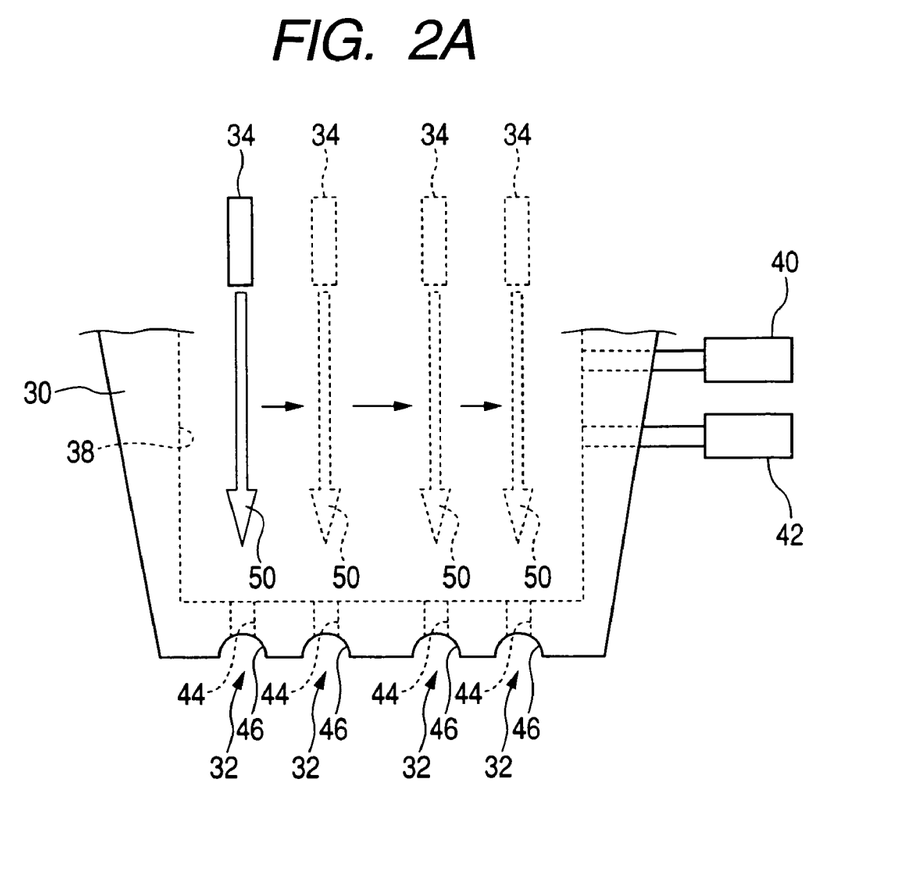
FIG. 2A is a front view of the apparatus and FIG. 2B is a bottom view of the apparatus.
Figure 2B:
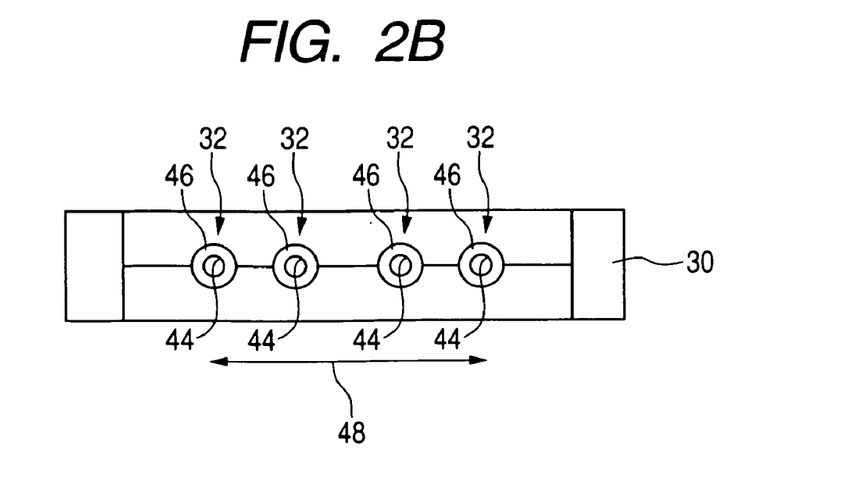

FIGS. 2A and 2B are explanatory views showing a structure of the pick-up nozzle 29 in the solder ball bonding apparatus, where FIG. 2A is a front view of the apparatus and FIG. 2B is a bottom view in FIG. 2A.

As shown in FIGS. 2A and 2B, in the solder ball bonding apparatus 10, the conical cylinder 30 is disposed at a center thereof. A conjugate space 38 is provided within the conical cylinder 30. The conjugate space 38 is connected to air feeding and discharging means 40 and nitrogen gas supplying means 42 as inert gas supplying means so that the solder balls can be sucked via the pick-up openings 32 by reducing the pressure within the conjugate space 38 or the interior of the conjugate space 38 can be released from a pressure reducing environment to an atmospheric pressure (so-called vacuum rupture) or nitrogen gas can be injected through the pick-up openings 32 by feeding the nitrogen gas into the conjugate space 38. Further, the transparent member 31 arranged substantially perpendicular to the laser beam passing through the conjugate space 38 is secured to an end of the conical cylinder 32 opposite to the pick-up openings 32. Due to the provision of the transparent member 31, the conjugate space 38 becomes a substantially closed or sealed space except the pick-up openings 32. A laser beam irradiated from the laser radiating unit 34 is passed through the transparent member 31 to be introduced into the conjugate space 38 and is irradiated onto the solder ball 12 through the pick-up openings 32. The transparent member 31 is made of glass, quartz or the like and is fixed with respect to the pick-up nozzle 29 by bolt claming or an adhesive.

Figure 3:
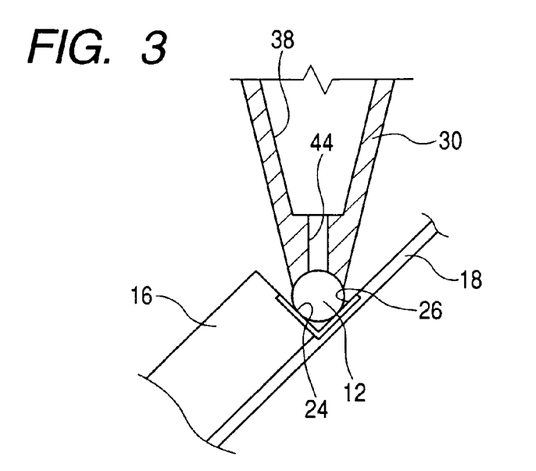
FIG. 3 is an explanatory view showing a condition that the conductive ball is regulated by a regulating face and an electrode area.

Further, each of the plural pick-up openings 32 formed in the lower portion of the conical cylinder 30 is provided at its center with a suction port 44 communicated with the conjugate space, and a regulating face 46 for regulating a rolling movement of the solder ball 12 is formed around the suction port 44. Although the regulating face 46 serves to regulate the rolling movement of the solder ball in directions shown by the arrow 48, if the direction of the arrow 48 is coincided with an edge line direction of the V-shaped groove defined between the electrodes 24 and 26, since a normal direction of the solder ball 12 normal to the direction 48 is regulated by the slider side electrode 24 and the flexor side electrode 26, the solder ball 12 is regulated by the regulating face 46 and the associated electrodes to be fixedly positioned at a predetermined position. Thus, after the solder ball 12 is conveyed to the electrode area by the pick-up opening 32, even when the suction of the pick-up opening 32 is ceased and the solder ball 12 can be separated from the pick-up opening 32, the solder ball 12 can be at its position without dislodging from the electrode area.

The laser radiating unit 34 disposed above the conical cylinder 30 is connected to laser radiating unit conveying means (not shown) different from the conveying means for the pick-up nozzle 29, independently from the pick-up nozzle. The laser radiating unit 34 can be shifted in the directions shown by the arrow 36 intermittently step by step. The step of the intermittent movement of the laser radiating unit corresponds to a distance between the adjacent suction ports 44 of the pick-up openings 32 so that, at any stopped position of the unit, the laser beam 50 can be irradiated onto the solder ball 12 through the suction port 44. Accordingly, by changing the relative position of the laser radiating unit 34 with respect to the conical cylinder 30 by operating the laser radiating unit conveying means, as shown in FIG. 2A, the laser beam 50 can be irradiated into the adjacent suction ports 44 continuously.

Incidentally, in the illustrated embodiment, while an example that the conveying means for shifting the laser radiating unit 34 physically are used was explained, the present invention is not limited to such an example, but the laser beam can be irradiated through the suction port 44 by using optical means. That is to say, the laser radiating unit 34 may include a polygon mirror, a scanning mirror and an f-θ lens and the like. According to the present invention, since the shifting amount of the laser radiating unit 34 is small and special specification such as air-tight is not required, also such an optical arrangement, the laser beam 50 can be irradiated through the suction port 44.

Further, in a case where the conveying means are constituted mechanically, any mechanism such as a precise feeding mechanism using a servo motor or a stepping motor can be selected in dependence upon the specification of the product.

Next, a procedure for performing the bonding between the slider side electrode 24 formed on the slider 16 of the magnetic head and the flexor side electrode 26 formed on the flexor 18 by using the solder ball bonding apparatus 10 having the above-mentioned construction will be explained.

Incidentally, the solder ball 12 used in the connection between the slider side electrode 24 and the flexor side electrode 26 is a very small ball having an outer diameter of about 80 to 150 microns.

Figure 4:
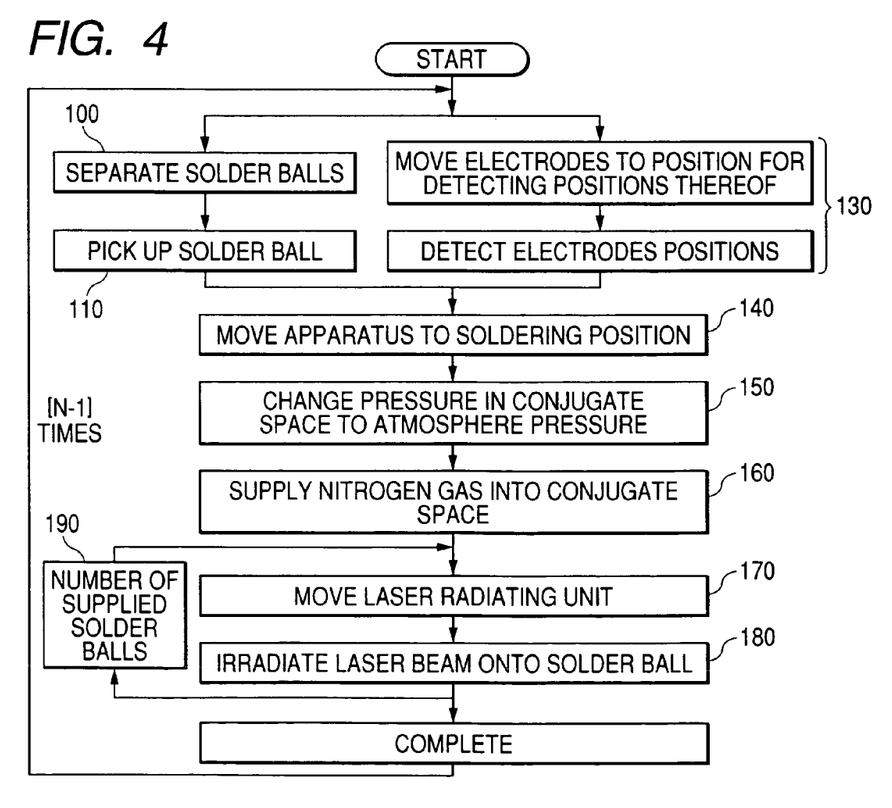
FIG. 4 is a flow chart showing operating steps of the conductive ball bonding apparatus.
Figure 5A:
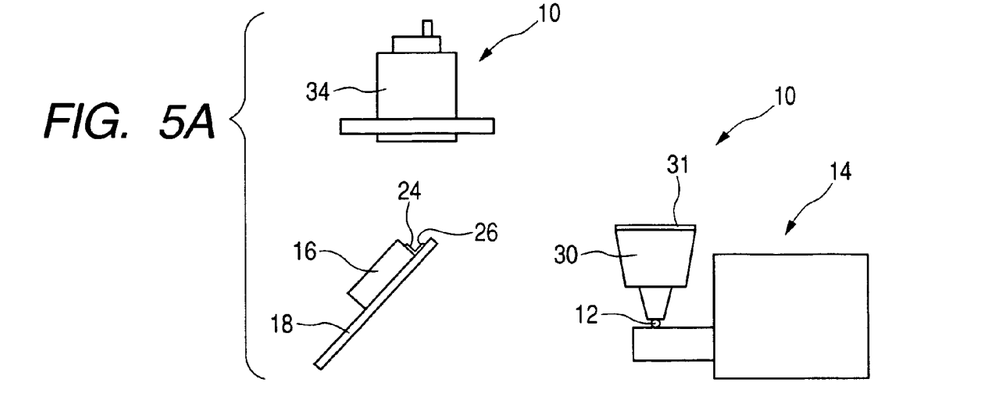
FIGS. 5A, 5B and 5C are explanatory views showing the operating steps of the conductive ball bonding apparatus.
Figure 5B:
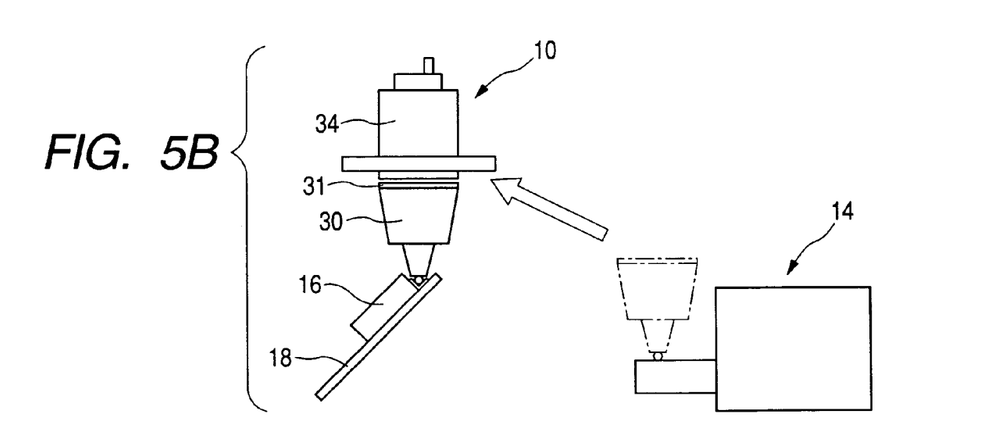
Figure 5C:
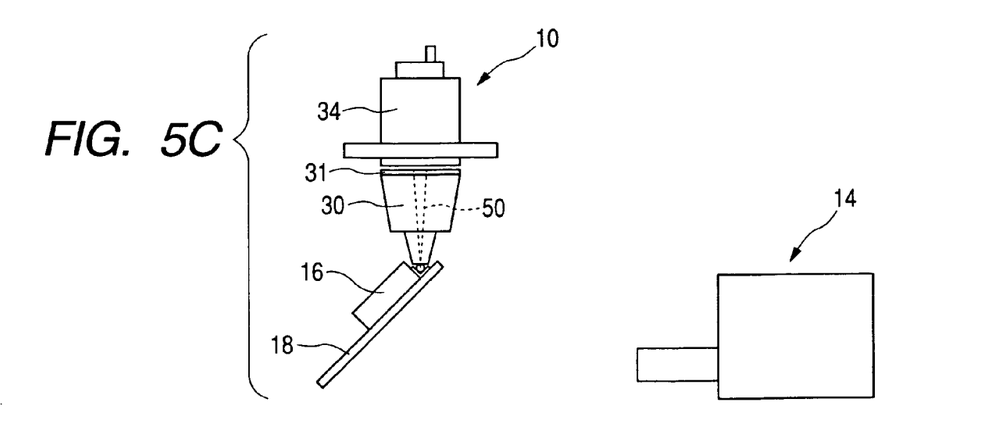

FIG. 4 is a flow chart showing an operating procedure of the solder ball bonding apparatus and FIGS. 5A to 5C are explanatory views showing the operating procedure of the solder ball bonding apparatus.

In the bonding in such a magnetic head, first of all, as shown in FIG. 5A, the bonding apparatus 10 is shifted toward the solder ball supplying device 14, and the solder ball 12 positioned at the supplying hole 28 of the supplying device 14 is absorbed by the pick-up opening 32 to shift the solder ball 12 toward the pick-up opening 32. Incidentally, during this shifting movement of the solder ball, the suction through the supplying hole 28 is ceased (step 100 in FIG. 4) and the air feeding and discharging means 40 are operated to bring the interior of the conjugate space 38 to the reduced pressure environment (step 110).

Incidentally, during the execution of the steps 100 and 110, the positions of the electrodes 24 and 26 to be bonded are detected by the image recognition means (step 130).

Then, after the processing operations of the steps 100, 110 and 130 are finished, as shown in FIG. 5B, the shifting means are operated to shift the bonding apparatus to the soldering position (step 140).

After the bonding apparatus 10 is shifted to the soldering position, the air feeding and discharging means 40 are operated to return the interior of the conjugate space 38 to the atmospheric pressure (vacuum rupture), and then, the nitrogen gas is introduced into the conjugate space 38 by the nitrogen gas supplying means 42, thereby injecting the nitrogen gas through the pick-up openings 32 of the pick-up nozzle (steps 150 and 160).

Figure 6:
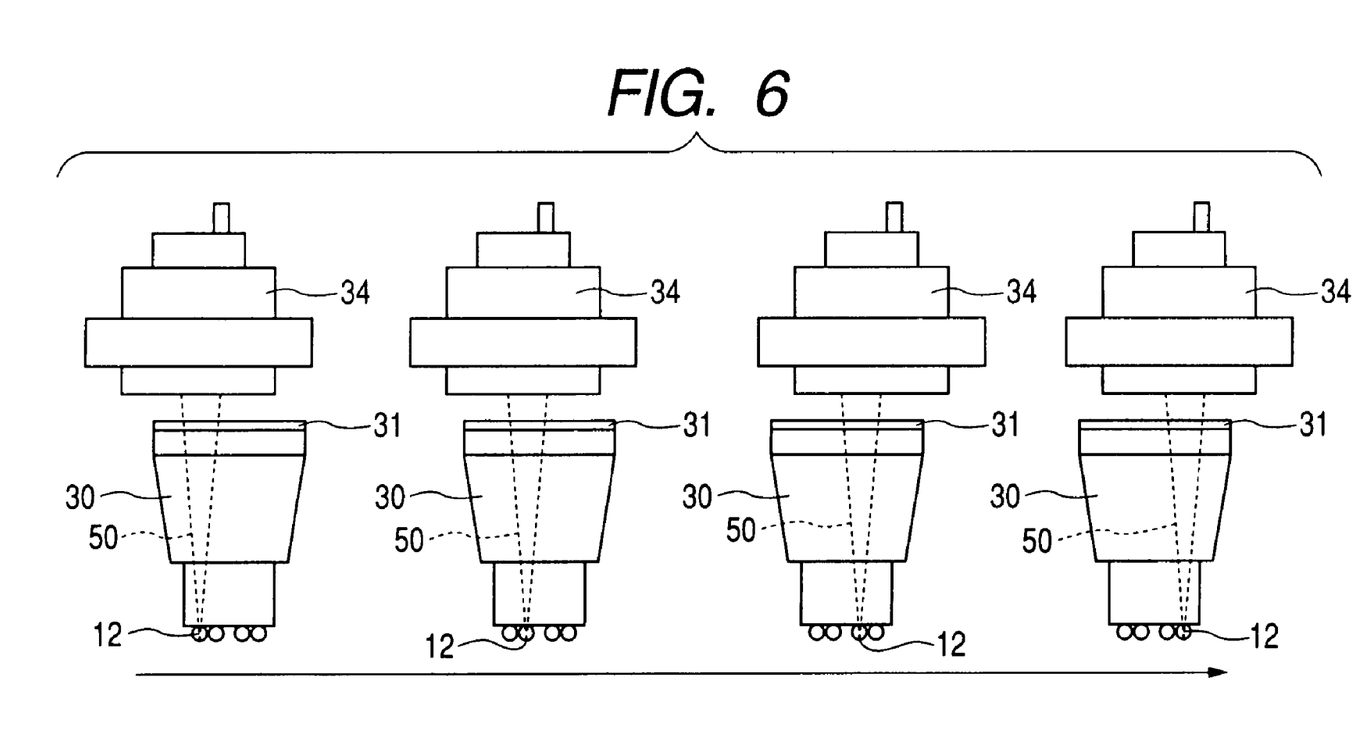
FIG. 6 is an operation explaining view showing a melting procedure of the conductive ball.

While maintaining the condition that the nitrogen gas is being injected in the step 160, the laser radiating unit 34 is shifted, and thereafter, as shown in FIG. 5C, the laser beam 50 is irradiated onto any solder ball 12 (steps 170 and 180). Then, as shown in FIG. 6, regarding the adjacent solder balls 12, the steps 170 and 180 are repeated by times corresponding to the number of solder balls 12 (step 190).

Incidentally, when the single solder ball alone is conveyed, the laser radiating unit 34 may be fixed. In this case, it is preferable that the electrodes to be bonded are previously installed below the laser radiating unit 34 (laser beam irradiating position) and the pick-up nozzle 29 is shifted between the laser radiating unit 34 and the electrodes to shift the solder ball between the electrodes and hold the solder ball therein.

In this way, when the plurality of solder balls are simultaneously positioned on the objects to be bonded and the solder balls are successively melted by the single laser radiating unit while maintaining the solder balls on the objects to be bonded, the bonding time can be reduced greatly in comparison with the conventional bonding processing in which the melting of one solder ball is treated as one step. That is to say, according to the Inventors' investigation, it was found that, by using the solder ball bonding apparatus according to the illustrated embodiment, the working efficiency can be enhanced by about 70% in comparison with the conventional bonding apparatuses.

Incidentally, in the above-mentioned embodiment, while an example that the pick-up nozzle having four pick-up openings is used was explained, the number of the pick-up openings is not limited to four. Further, although it is preferable that the pick-up opening has the shape as shown in the illustrated embodiment, the pick-up opening may have a normal opening shape which does not regulate the shifting movement of the solder ball.

Incidentally, in the illustrated embodiment, an example that the solder ball is used as the object to be held by the pick-up nozzle and the solder ball is conveyed between the slider side electrode and the flexor side electrode which are objects to be bonded and the solder ball is melted by the irradiation of the laser beam to perform the bonding between the electrodes was explained. However, the object to be held is not limited to the solder ball, and any pick-up nozzles applicable to various processes in which specific processing is performed by conveying the object to be held to a predetermined position and by irradiating a laser beam onto the object to be held are included within the scope of the present invention.

As many apparently widely different embodiments of the present invention can be made without departing from the sprit and scope thereof, it is to be understood that the invention is not limited to the specific embodiment thereof except as defined in the appended claims.

This application claims priority from Japanese Patent Application No. 2004-276655 filed on Sep. 24, 2004, which is hereby incorporated by reference herein.

What is claimed is:

1. A conductive ball bonding method in which plural electrodes formed on objects to be bonded are bonded by using a conductive ball to be melted, comprising the steps of:
   picking up said conductive ball and conveying said conductive ball onto said electrodes, by means of a pick-up nozzle having pick-up openings corresponding to said electrodes on said objects to be bonded;
   irradiating a laser beam in such a manner that the laser beam passes through a transparent member which covers a part of a conjugate space within said pick-up nozzle and passes through said pick-up opening of said pick-up nozzle to reach said conductive ball; and
   melting said conductive ball on said electrode by irradiation of the laser beam,
   wherein at a time when the laser beam passes through said pick-up opening, said pick-up opening acts as a mask for irradiating the laser beam.

2. A bonding method according to claim 1, wherein said pick-up nozzle is stopped in a condition that said conductive balls corresponding to said electrodes are supplied on said electrodes, and a laser radiating unit for irradiating the laser beam is shifted in a direction substantially in parallel with an arranging direction of said plural electrodes and melts said conductive balls.

3. A bonding method according to claim 1 or 2, wherein, when the laser beam is irradiated onto said conductive ball, inert gas is fed through said pick-up opening of said pick-up nozzle.

4. A conductive ball bonding apparatus in which a conductive ball is conveyed to electrodes formed on objects to be bonded and said conveyed conductive ball is melted by irradiation of a laser beam to perform bonding between said electrodes, comprising:
   a pick-up nozzle having a pick-up opening for picking up said conductive ball, a conjugate space communicated with said pick-up opening, and a transparent member disposed at a position opposed to said pick-up opening in said conjugate space and defining said conjugate space; and
   a laser radiating unit disposed at a position opposed to said pick-up opening with the interposition of said transparent member, wherein
   said laser radiating unit and said pick-up nozzle can be shifted relative to each other; and
   at a time when the laser beam passes through said pick-up opening, said pick-up opening acts as a mask for irradiating the laser beam.

5. A bonding apparatus according to claim 4, wherein the relative shifting movement between said laser radiating unit and said pick-up nozzle is caused along a straight line parallel with a plane substantially including plural bonded points on said electrodes.

6. A pick-up nozzle according to claim 1, wherein the pick-up opening blocks part of the laser beam so as to shape the laser beam to a desired form.

7. A pick-up nozzle which is used when predetermined processing is performed by conveying an object to be held to a predetermined position while absorbing and holding said object and by irradiating a laser beam onto said object to be held in a condition that said object to be held is substantially held at said predetermined position, said pick-up nozzle comprising:
   a pick-up opening for picking up said object to be held;
   a conjugate space communicated with said pick-up opening and capable of being evacuated and vacuum-ruptured;
   a mask for shaping an irradiation form of the laser beam; and
   a transparent member disposed at a position opposed to said pick-up opening and forming a part of a wall defining said conjugate space and capable of permeating the laser beam.

8. A pick-up nozzle according to claim 7, wherein said mask is said pick-up opening of the pick-up nozzle.

* * * * *